United States Patent
Cao et al.

(10) Patent No.: US 12,112,243 B2
(45) Date of Patent: Oct. 8, 2024

(54) METHOD FOR PREDICTING FLUCTUATION OF CIRCUIT PATH DELAY ON BASIS OF MACHINE LEARNING

(71) Applicant: Southeast University, Jiangsu (CN)

(72) Inventors: Peng Cao, Jiangsu (CN); Bingqian Xu, Jiangsu (CN); Jingjing Guo, Jiangsu (CN); Mengxiao Li, Jiangsu (CN); Jun Yang, Jiangsu (CN)

(73) Assignee: Southeast University, Jiangsu (CN)

( * ) Notice: Subject to any disclaimer, the term of this patent is extended or adjusted under 35 U.S.C. 154(b) by 1044 days.

(21) Appl. No.: 17/043,715

(22) PCT Filed: Mar. 12, 2019

(86) PCT No.: PCT/CN2019/077798
§ 371 (c)(1),
(2) Date: Sep. 30, 2020

(87) PCT Pub. No.: WO2020/034631
PCT Pub. Date: Feb. 20, 2020

(65) Prior Publication Data
US 2021/0056468 A1    Feb. 25, 2021

(30) Foreign Application Priority Data
Aug. 17, 2018    (CN) .................. 201810940335.X

(51) Int. Cl.
*G06N 20/00*    (2019.01)
*G01R 31/28*    (2006.01)

(52) U.S. Cl.
CPC ......... *G06N 20/00* (2019.01); *G01R 31/2882* (2013.01)

(58) Field of Classification Search
None
See application file for complete search history.

(56) References Cited

U.S. PATENT DOCUMENTS

| | | | |
|---|---|---|---|
| 2009/0248370 A1* | 10/2009 | Rutenbar | G06F 30/367 703/2 |
| 2013/0041608 A1 | 2/2013 | Charlebois et al. | |
| 2014/0059508 A1 | 2/2014 | Oh et al. | |

FOREIGN PATENT DOCUMENTS

| | | |
|---|---|---|
| CN | 1573760 | 2/2005 |
| CN | 102169515 | 8/2011 |

(Continued)

OTHER PUBLICATIONS

English machine translation of CN106777608A (Year: 2017).*
"International Search Report (Form PCT/ISA/210) of PCT/CN2019/077798," mailed on Jun. 12, 2019, pp. 1-5.

*Primary Examiner* — Walter L Lindsay, Jr.
*Assistant Examiner* — Geoffrey T Evans
(74) *Attorney, Agent, or Firm* — JCIP GLOBAL INC.

(57) ABSTRACT

A method for predicting the fluctuation of circuit path delay on the basis of machine learning, comprising the following steps: S1: selecting suitable sample characteristics by means of analyzing the relationship between circuit characteristics and path delay; S2: generating a random path by means of enumerating values of randomized parameters, acquiring the maximum path delay by means of performing Monte Carlo simulation on the random path, selecting a reliable path by means of the 3σ standard, and using the sample characteristics and path delay of the reliable path as a sample set (D); S3: establishing a path delay prediction model, and adjusting parameters of the model; S4: verifying the precision and stability of the path delay prediction model; S5: obtaining the path delay. The method for predicting the fluctuation of circuit path delay on the basis of machine learning has the advantages of high precision and low running time, thereby having remarkable advantages in the accuracy and efficiency of timing analysis.

5 Claims, 5 Drawing Sheets

(56) References Cited

FOREIGN PATENT DOCUMENTS

| CN | 103366028 | 10/2013 |
|---|---|---|
| CN | 106777608 | 5/2017 |
| CN | 109255159 | 1/2019 |

* cited by examiner

METHOD FOR PREDICTING FLUCTUATION OF CIRCUIT PATH DELAY ON BASIS OF MACHINE LEARNING

CROSS-REFERENCE TO RELATED APPLICATION

This application is a 371 of international application of PCT application serial no. PCT/CN2019/077798, filed on Mar. 12, 2019, which claims the priority benefit of China application no. 201810940335.X, filed on Aug. 17, 2018. The entirety of each of the above mentioned patent applications is hereby incorporated by reference herein and made a part of this specification.

TECHNICAL FIELD

The present invention relates to the field of integrated circuits, and in particular, to a method for predicting the fluctuation of circuit path delay.

DESCRIPTION OF RELATED ART

With the rise of intelligent devices such as the Internet of Things and wearables, a very-low voltage technology is a key and significant enabling technology thereof, and its design methodology has become the research focus in industry and academia. A near-threshold circuit has a remarkable advantage in energy efficiency compared to circuits at super-threshold voltage and sub-threshold voltage, thus arousing great interest in industry and academia. However, PVT variations in the case of a near-threshold voltage causes an exponential increase in a path delay varation, incurring a serious deterioration in circuit performance, and cancelling out the advantage in energy efficiency brought by the near-threshold circuit.

In the conventional path-based static timing analysis method, the path delay is calculated by establishing a feature library for combinational logic cells in a path. However, this method has the following shortcomings: On one hand, delay variations of the cells in the case of the near-threshold voltage are in a non-Gaussian distribution, and thus it is difficult to calculate the path delay by means of linear accumulation; on the other hand, the relevance to a delay time of the cells is not taken into consideration, resulting in excessive pessimism over the path delay.

SUMMARY

Invention objective: The objective of the present invention is to provide a method for predicting the fluctuation of circuit path delay on the basis of machine learning, which has high precision and low running time.

Technical Solution

Technical solutions: To achieve the foregoing objective, the present invention adopts the following technical solutions:

The method for predicting the fluctuation of circuit path delay on the basis of machine learning in the present invention includes the following steps:

S1: selecting suitable sample characteristics by means of analyzing the relationship between circuit characteristics and path delay;

S2: generating a random path by means of enumerating values of randomized parameters, acquiring the maximum path delay by means of performing Monte Carlo simulation on the random path, selecting a reliable path by means of the 3σ standard, and using the sample characteristics and path delay of the reliable path as a sample set;

S3: establishing a path delay prediction model, and adjusting parameters of the model;

S4: verifying the precision and stability of the path delay prediction model;

S5: obtaining the path delay.

Further, the sample characteristics in step S1 includes stage of a circuit path; a type, size, and polarity of each cell; load capacitance of each cell; and a path intrinsic delay.

Further, the path delay prediction model in step S3 is established by the following sub-steps:

S3.1: randomly selecting n samples in a returnable manner from data in a training set, and grouping the samples into a training set for generating a regression tree;

S3.2: generating an unpruned regression tree for each bootstrap sample, and modifying the regression tree; and performing random sampling of prediction variables at each node, and selecting an optimum segmentation point from these prediction variables; and S3.3: establishing the path delay prediction model by data clustering of n trees to predict a new path delay, and using an average value of clustering results as a path delay output by the path delay prediction model.

Further, the adjusting the parameters of the model in step S3 includes the following process: increasing the number of decision trees and the number of variables at each node, and selecting a parameter value in the case of a minimum error to optimize the model.

Further, step S4 includes the following process: verifying the precision of the path delay prediction model by calculating an average error of a training set, an average error and a maximum absolute error of a test set; and observing the change in the average error of the test set by changing the number of samples in the test set to verify the stability of the path delay prediction model.

Further, the generating the random path in step S2 includes the following process: selecting and randomly setting circuit structure parameters and parasitic parameters of the path, and generating a SPICE netlist file corresponding to the random path, where the circuit structure parameters include the stage of a circuit path, the type and size of each cell, and the polarity of a path input signal; and the parasitic parameters include the load capacitance of each cell.

Advantageous Effect

Advantageous effects: The present invention discloses a method for predicting the fluctuation of circuit path delay on the basis of machine learning, where a path delay prediction model is established and a timing analysis result is obtained. The method has the advantages of high precision and low running time, thereby having remarkable advantages in the accuracy and efficiency of timing analysis. By using a 5-stage path within a process corner at 0.6V and 25° C. as an example, an average error of the training set and that of the test set are both lower than 5%, as low as 1.27% and 2.83% respectively.

DETAILED DESCRIPTION OF THE EMBODIEMENTS

Figure 1:
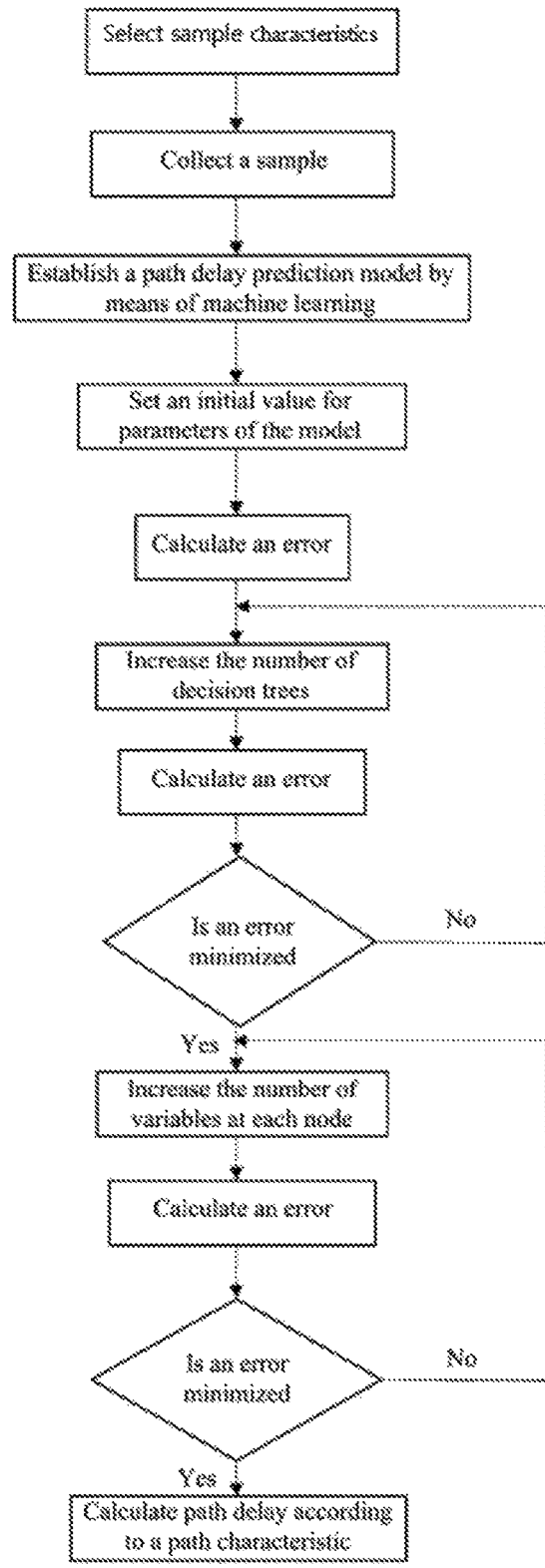
FIG. 1 is a flowchart of a method in a specific implementation of the present invention.

A specific implementation manner of the present invention discloses a method for predicting the fluctuation of circuit path delay on the basis of machine learning. As shown in FIG. 1, the method includes the following steps:

S1: Suitable sample characteristics is selected by means of analyzing the relationship between circuit characteristics and path delay, where the sample characteristics includes the cell type, the cell size, the cell polarity, load capacitance, and a path intrinsic delay.

S2: A random path is generated by means of enumerating values of randomized parameters, the maximum path delay is acquired by means of performing Monte Carlo simulation on the random path, a reliable path is selected by means of the 3σ standard, and sample characteristics and path delay of the reliable path are used as a sample set. Generating the random path includes the following process: selecting and randomly setting circuit structure parameters and parasitic parameters of the path, and generating a SPICE netlist file corresponding to the random path. The randomly set circuit structure parameters include the stage of a circuit path; and the type, size, and polarity of each cell in the path. The randomly set circuit parasitic parameters include the load capacitance of each cell. In these parameters, the cell type is used to represent a type of a logic cell such as an inverter or a NAND gate, is denoted by a type number, and follows a uniform distribution. The cell size is used to represent a drive capability of a corresponding cell, is denoted by a normalized drive multiple, and also follows a uniform distribution. The cell polarity is used to represent a rising or falling output waveform of a cell. The polarity of each cell is determined according to a polarity of the previous cell and a type of the current cell. The load capacitance is used to represent load capacitance of each cell in the path, and follows a uniform distribution. During Monte Carlo simulation, relevant process parameters are set to random quantities which follow a Gaussian distribution. Delay values obtained after the Monte Carlo simulation on the random paths are arranged in ascending order, and a delay value corresponding to the quantile of 99.87% is selected as a 3σ-based delay value of the current random path.

S3: A path delay prediction model is established, and parameters of the model are adjusted. Adjusting the parameters of the model includes the following process: increasing the number of decision trees and the number of variables at each node, and selecting a parameter value in the case of a minimum error to optimize the model. A specific process is as follows: First, a value of the number of variables at each node is fixed, and the number of decision trees is changed; a SPICE simulation result is used as a label value to calculate an error, and a value of the number of the decision trees is increased; and the number of decision trees that corresponds to a minimum error is used as the number of decision trees in the model. Afterwards, a value of the number of decision trees is fixed, and the number of variables at each node is changed; a SPICE simulation result is used as a label value to calculate an error, and a value of the number of the variables at each node is increased; and the number of variables at each node that corresponds to a minimum error is used as the number of variables at each node in the model.

S4: The precision and stability of the path delay prediction model are verified.

S5: The path delay is obtained.

Figure 2:
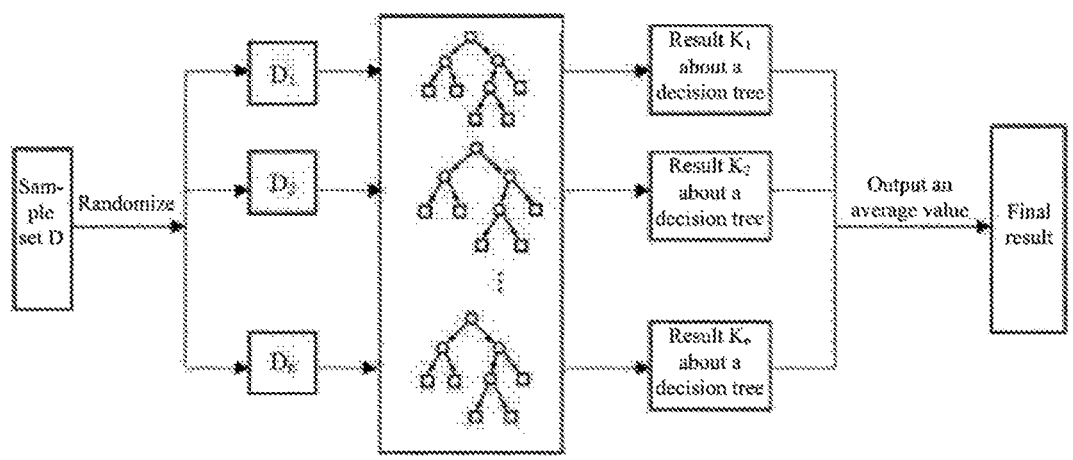
FIG. 2 is a flowchart of establishing a path delay prediction model in a specific implementation of the present invention.

As shown in FIG. 2, the path delay prediction model in step S3 is established by the following sub-steps:

S3.1: randomly selecting n samples in a returnable manner from data in a training set, and using the samples as the training set for generating a regression tree;

S3.2: generating an unpruned regression tree for each bootstrap sample, and modifying the regression tree; and performing random sampling of prediction variables at each node, and selecting an optimum segmentation point from these prediction variables; and S3.3: predicting a new path delay by data clustering of n trees, and using an average value of clustering results as the predicted path delay.

Step S4 includes the following process: verifying the precision of the path delay prediction model by calculating an average error of a training set, an average error a maximum absolute error of a test set; and verifying the stability of the path delay prediction model by changing the number of samples in the test set and observing a change in the average error of the test set.

Figure 3A:
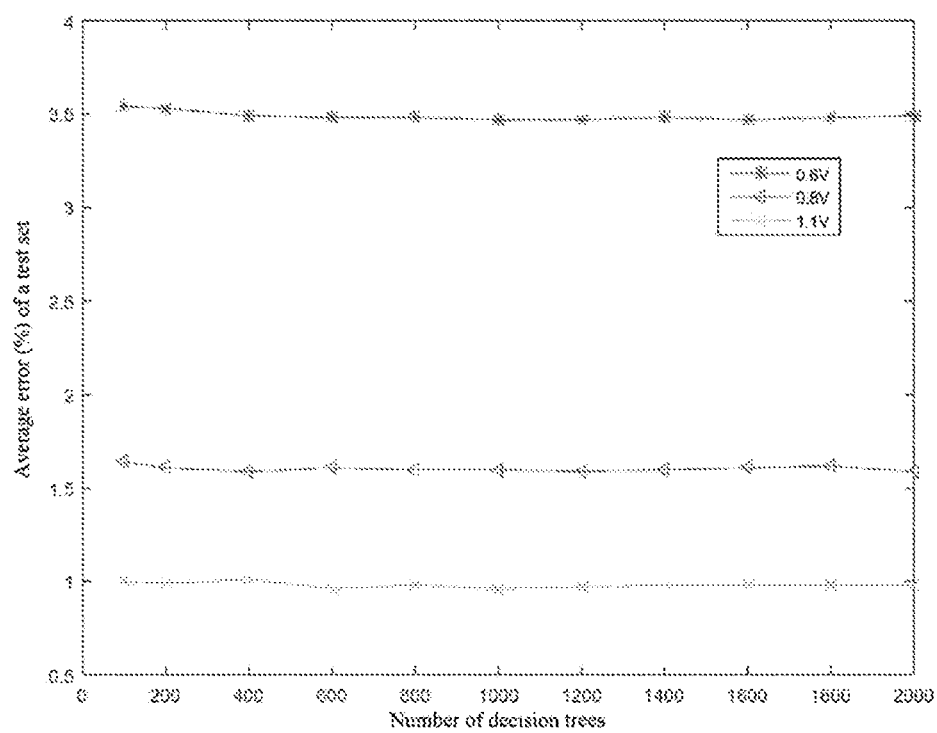
FIG. 3(a) shows an impact of an adjustment to the number of decision trees on model precision at different voltages in a specific implementation of the present invention.
Figure 3B:
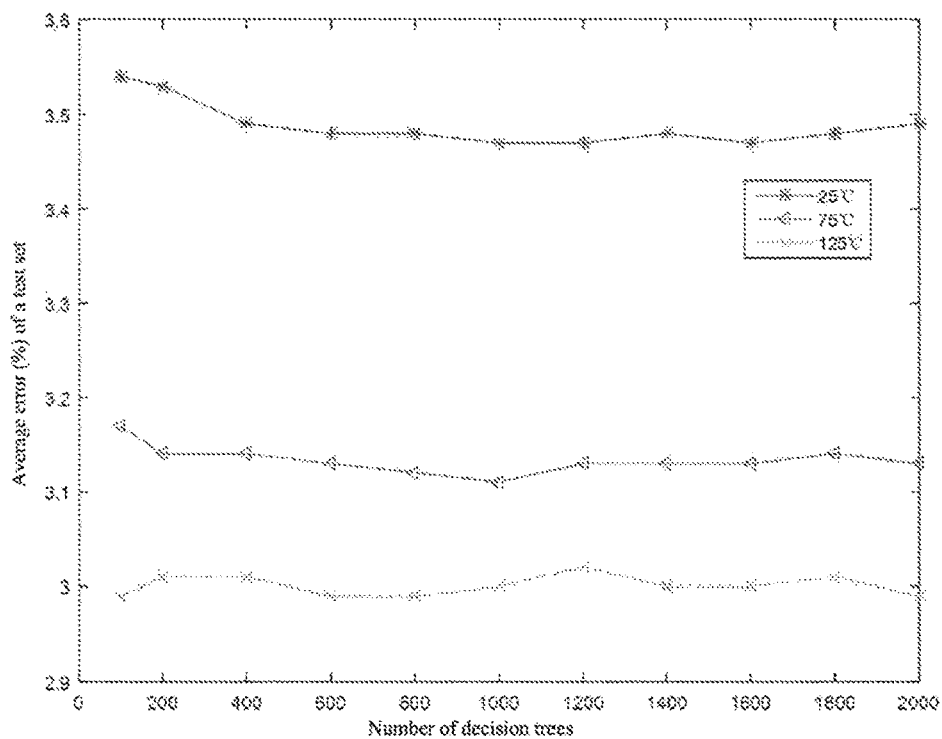
FIG. 3(b) shows an impact of an adjustment to the number of decision trees on model precision at different temperatures in a specific implementation of the present invention.
Figure 3C:
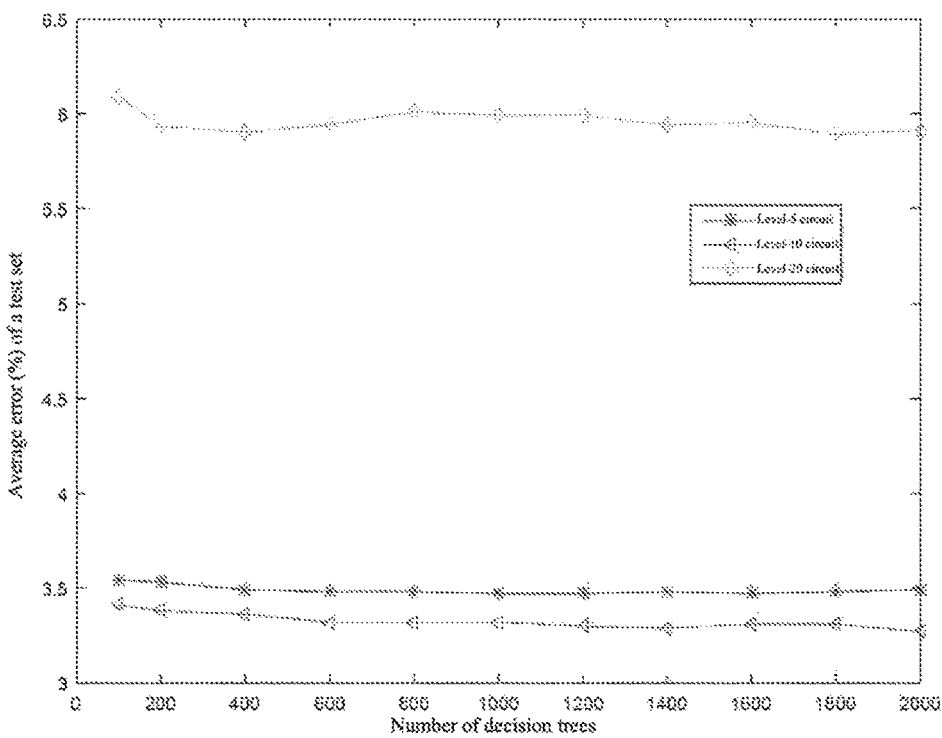
FIG. 3(c) shows an impact of an adjustment to the number of decision trees on model precision at different circuit stages in a specific implementation of the present invention.

FIGS. 3(a)-(c) show an impact of an adjustment to the number of decision trees on the model precision in a specific implementation of the present invention. The number of variables at each node is kept unchanged, and the number of the decision trees is changed, to re-establish a prediction model. Moreover, the training set is changed according to a change in the path stage, temperature, and voltage, to obtain a new prediction model. An average error of the test set is calculated, to obtain FIGS. 3(a)-(c). FIG. 3(a) shows an impact of the number of decision trees on the model in a 5-stage path, at the temperature of 25° C. and different voltages, and under the conditions that the number of samples in the training set is 800 and the number of samples in the test set is 200. FIG. 3(b) shows an impact of the number of decision trees on the model in a 5-stage path, at the voltage of 0.6V and different temperatures, and under the conditions that the number of samples in the training set is 800 and the number of samples in the test set is 200. FIG. 3(c) shows an impact of the number of decision trees on the model in circuits at different stages, at the voltage of 0.6V and the temperature of 25° C., and under the conditions that the number of samples in the training set is 800 and the number of samples in the test set is 200.

Figure 4A:
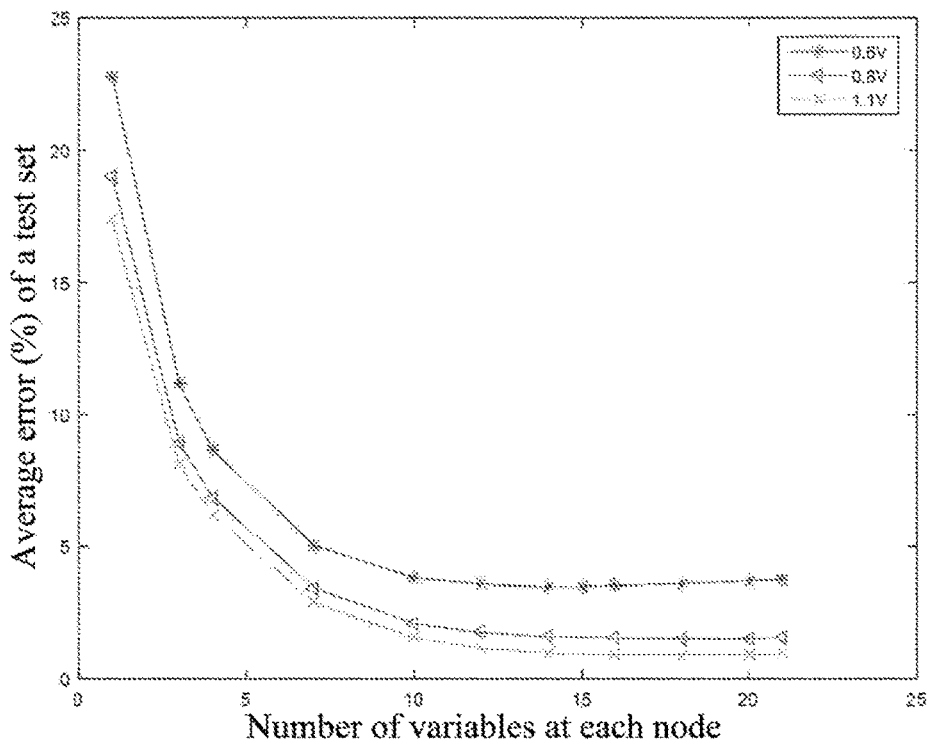
FIG. 4(a) shows an impact of an adjustment to the number of variables at each node on model precision at different voltages in a specific implementation of the present invention.
Figure 4B:
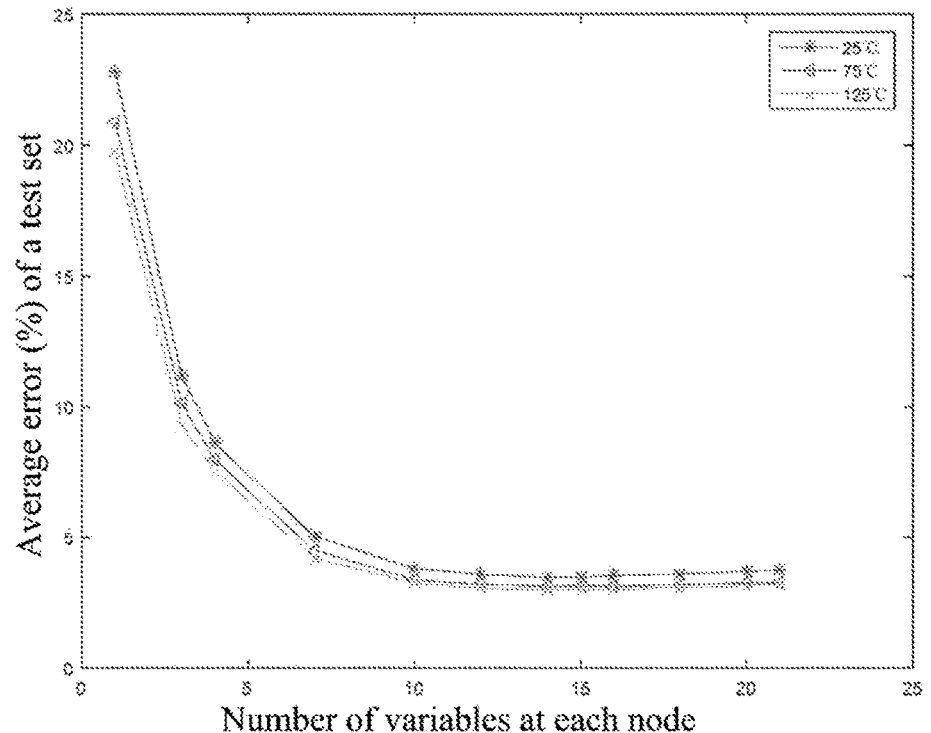
FIG. 4(b) shows an impact of an adjustment to the number of variables at each node on model precision at different temperatures in a specific implementation of the present invention.
Figure 4C:
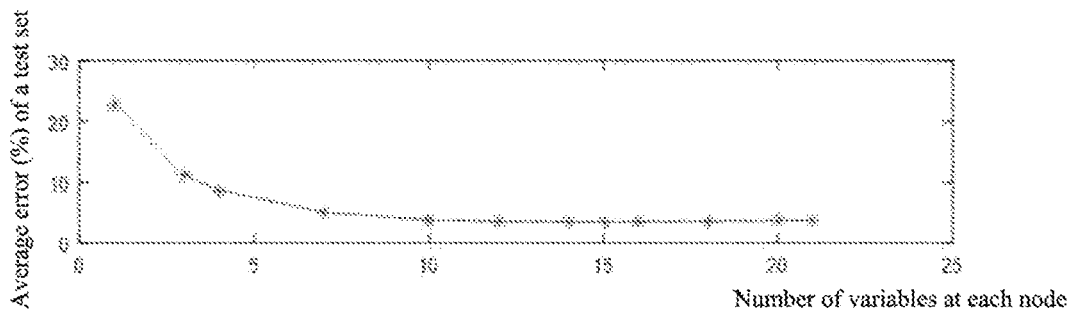
FIG. 4(c) shows an impact of an adjustment to the number of variables at each node on model precision in a 5-stage circuit in a specific implementation of the present invention.
Figure 4D:
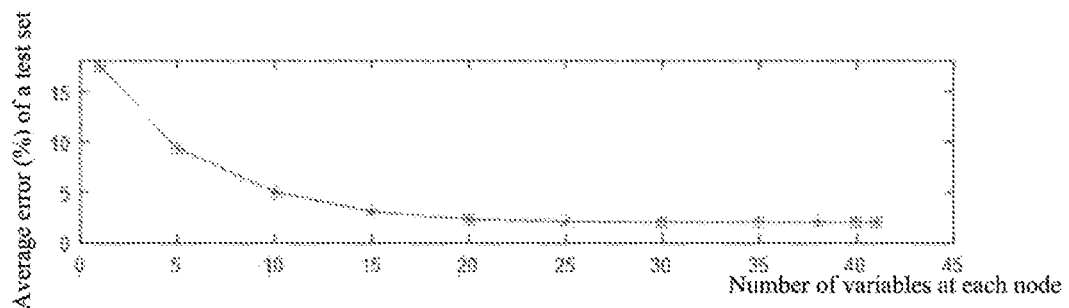
FIG. 4(d) shows an impact of an adjustment to the number of variables at each node on model precision in a 10-stage circuit in a specific implementation of the present invention.
Figure 4E:
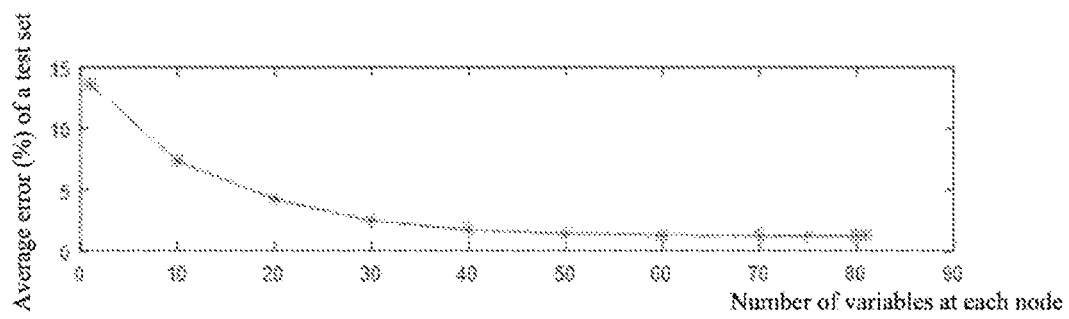
FIG. 4(e) shows an impact of an adjustment to the number of variables at each node on model precision in a 20-stage circuit in a specific implementation of the present invention.

FIGS. 4(a)-(e) show an impact of an adjustment to the number of variables at each node on model precision in a specific implementation of the present invention. The number of decision trees is kept unchanged, and the number of variables at each node is changed, to re-establish a prediction model. Moreover, the training set is changed according to a change in the path stage, temperature, and voltage, to obtain a new prediction model. An average error of the test set is calculated, to obtain FIGS. 4(a)-(e). FIG. 4(a) shows an impact of the number of variables at each node on the model in a 5-stage path, at the temperature of 25° C. and different voltages, and under the conditions that the number of samples in the training set is 800 and the number of samples in the test set is 200. FIG. 4(b) shows an impact of the number of variables at each node on the model in a 5-stage path, at the voltage of 0.6V and different temperatures, and under the conditions that the number of samples in the training set is 800 and the number of samples in the test set is 200. FIG. 4(c) shows an impact of the number of variables at each node on the model in a 5-stage circuit, at the voltage of 0.6V and the temperature of 25° C., and under the conditions that the number of samples in the training set is 800 and the number of samples in the test set is 200. FIG. 4(d) shows an impact of the number of variables at each node on the model in a 5-stage circuit, at the voltage of 0.6V and the temperature of 25° C., and under the conditions that the number of samples in the training set is 800 and the number of samples in the test set is 200. FIG. 4(e) shows an impact of the number of variables at each node on the model in a 20-stage circuit, at the voltage of 0.6V and the temperature of 25° C., and under the conditions that the number of samples in the training set is 800 and the number of samples in the test set is 200.

What is claimed is:

1. A method for manufacturing an integrated circuit based on a prediction of a fluctuation of circuit path delay on the basis of machine learning, comprising the following steps:
   S1: selecting suitable sample characteristics by means of analyzing a relationship between circuit characteristics and a path delay;
   S2: generating a random path by means of enumerating values of randomized parameters, acquiring a maximum path delay by means of performing Monte Carlo simulation on the random path, selecting a reliable path by means of the 3σ standard, and using the sample characteristics and the path delay of the reliable path as a sample set;
   S3: establishing a path delay prediction model, and adjusting parameters of the path prediction model;
   S4: verifying a precision and a stability of the path delay prediction model;
   S5: obtaining an output path delay;
   S6: generating a layout of the integrated circuit based on the output path delay; and
   S7: manufacturing the integrated circuit based on the layout, wherein the path delay prediction model in step S3 is established by the following sub-steps:
      S3.1: randomly selecting n samples in a returnable manner from data in a training set, and using the samples as the training set for generating a regression tree;
      S3.2: generating an unpruned regression tree for each sample, and modifying the regression tree; and performing random sampling of prediction variables at each node of the unpruned regression tree, and selecting an optimum segmentation point from these prediction variables; and
      S3.3: establishing the path delay prediction model by data clustering of n unpruned regression trees to predict a new path delay, and using an average value of clustering results as the output path delay by the path delay prediction model.

2. The method according to claim 1, wherein the sample characteristics in step S1 comprise a stage of a circuit path, a type of each cell, a size of each cell, a polarity of each cell, a load capacitance of each cell and a path intrinsic delay.

3. The method according to claim 1, wherein the adjusting the parameters of the model in step S3 comprises the following process: increasing the number of decision trees and the number of variables at each node, and selecting a parameter value in the case of a minimum error to optimize the model.

4. The method according to claim 1, wherein step S4 comprises the following process: verifying the precision of the path delay prediction model by calculating an average error of a training set, an average error and a maximum absolute error of a test set; and verifying the stability of the path delay prediction model by changing the number of samples in the test set and observing a change in the average error of the test set.

5. The method according to claim 1, wherein the generating the random path in step S2 comprises the following process: selecting and randomly setting circuit structure parameters and parasitic parameters of the path, and generating a SPICE netlist file corresponding to the random path, wherein the circuit structure parameters comprise a stage of a circuit path, a type of each cell and size of each cell, and a polarity of a path input signal; and the parasitic parameters comprise a load capacitance of each cell.

* * * * *